(12) United States Patent
Kim et al.

(10) Patent No.: US 12,159,806 B2
(45) Date of Patent: Dec. 3, 2024

(54) METHOD OF MANUFACTURING A SEMICONDUCTOR DEVICE WITH JUNCTION FET TRANSISTORS HAVING MULTI PINCH-OFF VOLTAGES

(71) Applicant: SK keyfoundry Inc., Cheongju-si (KR)

(72) Inventors: Ji Man Kim, Cheongju-si (KR); Hee Hwan Ji, Daejeon (KR); Song Hwa Hong, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

(21) Appl. No.: 18/423,674

(22) Filed: Jan. 26, 2024

(65) Prior Publication Data

US 2024/0243132 A1    Jul. 18, 2024

Related U.S. Application Data

(62) Division of application No. 17/554,205, filed on Dec. 17, 2021, now Pat. No. 11,923,368.

(30) Foreign Application Priority Data

Jun. 11, 2021    (KR) .................. 10-2021-0075938

(51) Int. Cl.
*H01L 21/82* (2006.01)
*H01L 21/8232* (2006.01)
(Continued)

(52) U.S. Cl.
CPC .. *H01L 21/8232* (2013.01); *H01L 21/823418* (2013.01); *H01L 21/823493* (2013.01); *H01L 27/098* (2013.01); *H01L 27/088* (2013.01)

(58) Field of Classification Search
CPC .............. H01L 27/098; H01L 21/8232; H01L 21/823418; H01L 21/823493;
(Continued)

(56) References Cited

U.S. PATENT DOCUMENTS 7,598,547 B2    10/2009    Pendharker et al.
9,287,413 B2    3/2016    Chen et al.
(Continued)

OTHER PUBLICATIONS

Korean Office Action issued on Jun. 21, 2022 in corresponding Korean Patent Application No. 10-2021-0075938 (6 pages in Korean).

*Primary Examiner* — Shouxiang Hu
(74) *Attorney, Agent, or Firm* — NSIP Law

(57) ABSTRACT

A semiconductor device includes a first junction-gate field-effect transistor (JFET) having a first pinch-off voltage, and a second JFET having a second pinch-off voltage higher than the first pinch-off voltage. The first JFET includes a first top gate region disposed on a surface of a substrate, a first channel region surrounding the first top gate region, and a first bottom gate region disposed under the first channel region. The second JFET includes a second top gate region disposed on the surface and having a same depth with the first top gate region relative to the surface, a second channel region surrounding the second top gate region and disposed deeper than the first channel region relative to the surface, and a second bottom gate region disposed under the second channel region and being deeper than the first bottom gate region relative to the surface.

13 Claims, 16 Drawing Sheets

(51) Int. Cl.
*H01L 21/8234* (2006.01)
*H01L 27/098* (2006.01)
*H01L 27/088* (2006.01)

(58) Field of Classification Search
CPC .............. H01L 27/088; H01L 29/1066; H01L 29/66901; H01L 29/0649; H01L 29/808; H01L 27/085; H01L 29/0692
See application file for complete search history.

(56) References Cited

U.S. PATENT DOCUMENTS

| | | |
|---|---|---|
| 2002/0123174 A1 | 9/2002 | Casady et al. |
| 2004/0222475 A1 | 11/2004 | Hao et al. |
| 2007/0278520 A1 | 12/2007 | Davies |
| 2011/0136341 A1* | 6/2011 | Davies ................ H01L 27/0605 |
| | | 257/E21.159 |
| 2012/0063049 A1 | 3/2012 | Modica et al. |
| 2014/0062524 A1 | 3/2014 | Hu et al. |
| 2014/0332858 A1* | 11/2014 | Chen ................ H01L 29/66901 |
| | | 257/268 |

* cited by examiner

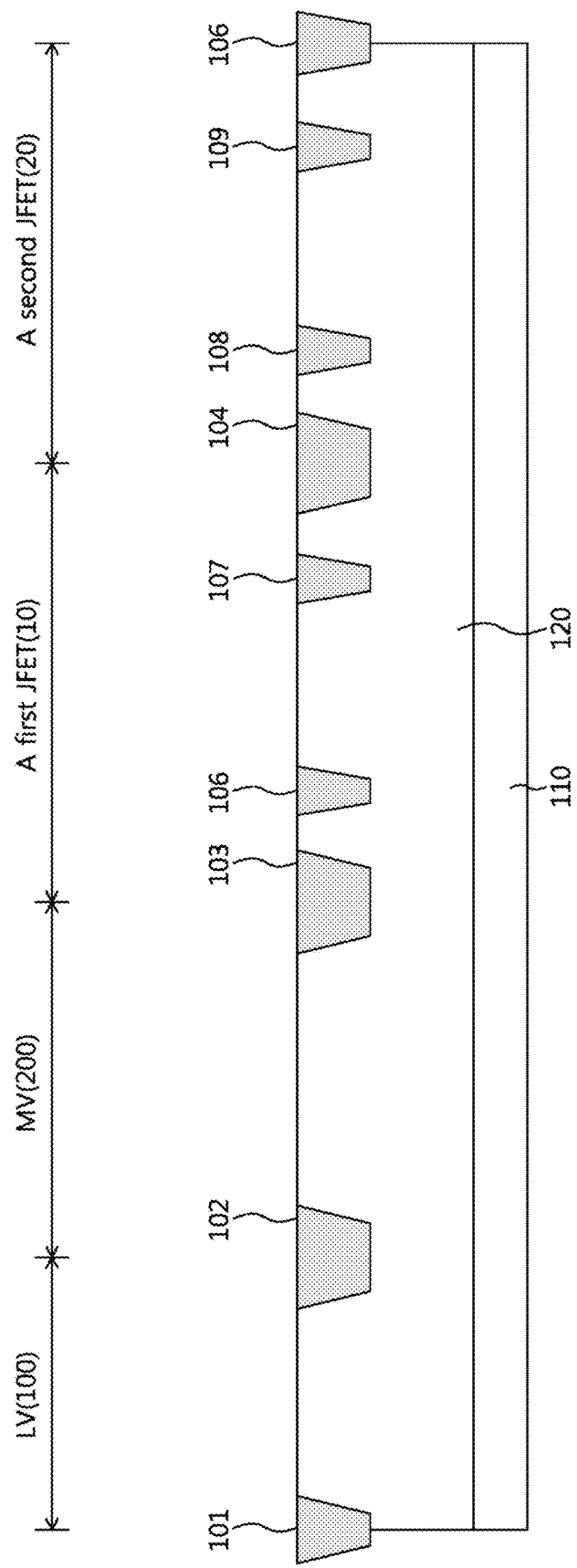

METHOD OF MANUFACTURING A SEMICONDUCTOR DEVICE WITH JUNCTION FET TRANSISTORS HAVING MULTI PINCH-OFF VOLTAGES

CROSS-REFERENCE TO RELATED APPLICATION

This application is a Divisional Application of application Ser. No. 17/554,205, filed Dec. 17, 2021, which claims priority under 35 U.S.C. § 119 to Korean Patent Application No. 10-2021-0075938 filed on Jun. 11, 2021, in the Korean Intellectual Property Office, the disclosures of which is incorporated herein by reference for all purposes.

BACKGROUND

1. Field

The following disclosure relates to a semiconductor device including Junction FET Transistor that has multi pinch-off voltage (Vp) and a method of manufacturing the same.

2. Description of Related Art

When various pinch-off voltages or cut-off voltages are needed in a Junction FET Transistor (hereafter, JFET), each channel region may be formed to have a different pinch-off voltage by adjusting a doping energy of impurities or an amount of doping in a channel region. In this case, a photo process and a diffusion process, for example, may be added in each device when the JFET is made respectively according to a pinch-off voltage, which may increase time and cost of production.

Therefore, a JFET having a single pinch-off voltage is sometimes used. However, when a JFET providing a single pinch-off voltage is used, it may be desirable to use a relatively low pinch-off voltage to satisfy various operating voltages inside an IC chip. In such a case, the current drive efficiency may decline when compared to when a relatively high pinch-off voltage is used.

While the current drive efficiency may be compensated by designing a relatively large JFET area, the area of the IC chip may become undesirably large.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, a semiconductor device includes a first junction-gate field-effect transistor (JFET) having a first pinch-off voltage, and a second JFET having a second pinch-off voltage higher than the first pinch-off voltage. The first JFET includes a first top gate region disposed on a surface of a substrate, a first channel region surrounding the first top gate region, and a first bottom gate region disposed under the first channel region, wherein the first channel region and the first bottom gate region have different conductivity types. The second JFET includes a second top gate region disposed on the surface and having a same depth with the first top gate region relative to the surface, a second channel region surrounding the second top gate region and disposed deeper than the first channel region relative to the surface, and a second bottom gate region disposed under the second channel region and being deeper than the first bottom gate region relative to the surface. The second channel region and the second bottom gate region have different conductivity types.

The first JFET may further include a first high concentration source region and a first high concentration drain region disposed in the first channel region and spaced apart from the first top gate region. The second JFET may further include a second high concentration source region and a second high concentration drain region disposed in the second channel region and spaced apart from the second top gate region.

The first JFET may further include a first device isolation film disposed in contact with the first channel region, and the first bottom gate region and the first device isolation film may be disposed in contact with each other. The second JFET may further include a second device isolation film disposed in contact with the second channel region, and the second bottom gate region and the second device isolation film may be disposed spaced apart from each other.

The first JFET may further include a first well region having a same conductivity type as the first bottom gate region and disposed to surround the first bottom gate region. The second JFET may further include a second well region having a same conductivity type as the second bottom gate region and disposed to surround the second bottom gate region.

The first JFET may further include a silicide blocking film disposed around the first top gate region.

Relative to the surface, a depth of a bottom surface of the first bottom gate region may be shallower than a depth of a bottom surface of the second bottom gate region.

In another general aspect, a manufacturing method of a semiconductor device, includes: forming a first junction-gate field-effect transistor (JFET) in a first JFET region of a substrate and a second JFET in a second JFET region of the substrate; forming a buffer film in the first JFET region; exposing the substrate in the second JFET region; forming a first bottom gate region and a second bottom gate region, simultaneously, in the first JEFT region and the second JEFT region, respectively, by performing a first ion implantation to the substrate using the buffer film as a mask; forming a first bottom gate region and a second channel region, simultaneously, in the first JEFT region and the second JEFT region, respectively, by performing a second ion implantation to the substrate using the buffer film as another mask, wherein the first second channel region and the second channel region are formed on the first bottom gate region and the second bottom gate region, respectively; removing the buffer film; forming a first top gate region and a second top gate region, simultaneously, in the first JEFT region and the second JEFT region, respectively; and forming a first second silicide layer and a second silicide layer, simultaneously, in the first top gate region and the second top gate region, respectively. Relative to a surface of the substrate, a depth of the second channel region is deeper than a depth of the first channel region.

A pinch-off voltage of the first JFET may be lower than a pinch-off voltage of the second JFET.

The first JFET may further include a first high concentration source region and a first high concentration drain region formed in the first channel region and spaced apart from the first top gate region. The second JFET may further include a second high concentration source region and a second high concentration drain region formed in the second channel region and spaced apart from the second top gate region.

The first JFET may further include, forming a first device isolation film in the substrate; and forming a first well region surrounding the first device isolation film. The first bottom gate region and the first device isolation film may be formed in contact with each other. The second JFET may further include forming a plurality of second device isolation films in the substrate; and forming a second well region surrounding the plurality of the second device isolation films. The second bottom gate region and the plurality of the second device isolation films may be formed spaced apart from each other.

Relative to the surface, a depth of a bottom surface of the first bottom gate region may be shallower than a depth of a bottom surface of the second bottom gate region.

Relative to the surface, the first top gate region and the second top gate region have a same depth.

In another general aspect, a semiconductor device includes junction-gate field-effect transistors (JFETs) each having a pinch-off voltage. Each of the JFETs includes a top gate region disposed on a surface of a substrate, a channel region surrounding the first top gate region, and a bottom gate region disposed under the channel region. The channel region and the bottom gate region have different conductivity types, and the bottom gate region of one of the JFETs may be deeper than the bottom gate region of another of the JFETs.

Each of the JFETs may further include a high concentration source region and a high concentration drain region disposed in the channel region and spaced apart from the top gate region.

Each of the JFETs may further include a device isolation film disposed in contact with the channel region, the bottom gate region and first device isolation film of the other of the JFETs may be disposed in contact with each other, and the bottom gate region and the device isolation film of the one of the JFETs may be disposed spaced apart from each other.

Each of the JFETs may further include a well region having a same conductivity type as the bottom gate region and disposed to surround the bottom gate region.

The other of the JFETs may further include a silicide blocking film disposed around a corresponding top gate region.

Relative to the surface, a depth of a bottom surface of the bottom gate region of the other of the JFETs may be shallower than a depth of a bottom surface of the bottom gate region of the one of the JFETs.

Other features and aspects will be apparent from the following detailed description, the drawings, and the claims.

BRIEF DESCRIPTION OF THE DRAWINGS

FIGS. 7A-7J show a manufacturing method of a semiconductor device including a JFET according to an embodiment of the disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
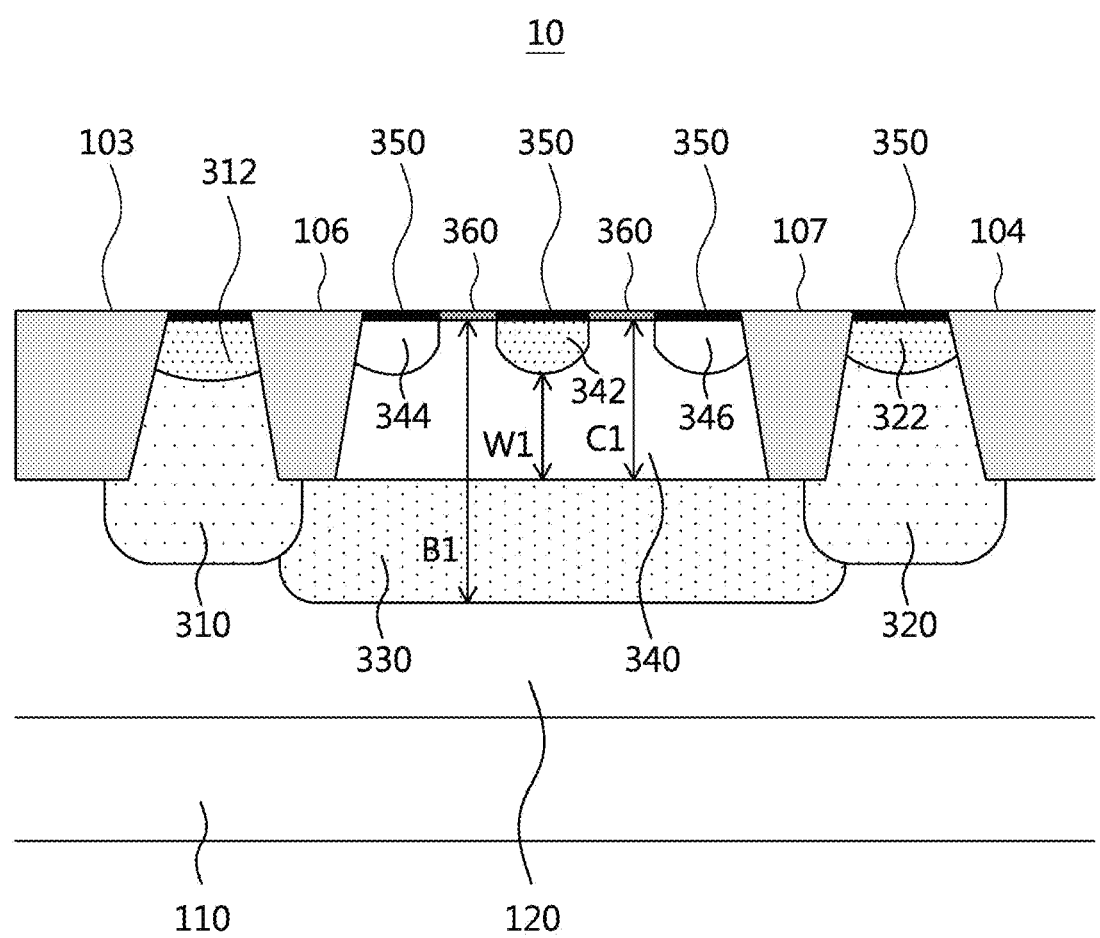
FIG. 1 is a cross-sectional view of a first JFET according to an embodiment of the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Embodiments of the disclosure is for providing a semiconductor device with a junction-gate field-effect transistor (JFET) that has multi pinch-off voltages and providing a manufacturing method of the same, by improving a manufacturing process of a semiconductor device.

Embodiments of the disclosure is also for providing a semiconductor device with a JFET that provides multi pinch-off voltages and providing a manufacturing method of the same, by adjusting impurities doping depth of a channel region.

The detailed description of the disclosure is given below, with embodiments shown in drawings.

FIG. 1 is a cross-sectional view of a first JFET according to an embodiment of the disclosure.

With reference to FIG. 1, a first JFET 10 includes a deep well region (hereafter, referred to as DNW 120) doped by an N-type dopant in a semiconductor substrate 110, a plurality of device isolation films 103, 104, 106, 107, first well regions 310, 320 connected to each other, first pick up regions 312, 322, a first bottom gate region 330, a first channel region 340, a first top gate region 342, a first source region 344 and a first drain region 346, a silicide layer 350, and a silicide blocking film 360.

Herein, first pick up regions 312, 322 may be formed in first well regions 310, 320, respectively. A first source region 344, a first drain region 346, and a first top gate region 342 may be formed in a first channel region 340. A first top gate region 342 and a first bottom gate region 330 are formed by an ion implantation with a P-type dopant. A first channel region 340 is an N-type channel region and formed by an ion implantation with an N-type dopant.

A first channel region 340 may have a depth C1. The depth C1 of the first channel region 340 is almost the same as depths of the isolation films 106, 107. A first bottom gate region 330 may have a depth B1. A first channel region 340 may have a first channel width W1. Herein, the first channel width W1 is a distance between a first top gate region 342 and a first bottom gate region 330. The first channel width W1 is less than the depth C1 of the first channel region 340. A doping concentration of a first top gate region 342 may be higher than a doping concentration of a first bottom gate region 330. A first top gate region 342 and a first bottom gate region 330 may have the same conductivity type, which may be a P-type doping region. Thus, a space between a first top gate region 342 and a first bottom gate region 330 may become a channel region. A channel may open, and current may flow by a predetermined voltage amount. On the other hand, when the voltage is over a first pinch-off voltage (Vp), the space between a first top gate region 342 and a first bottom gate region 330 may be connected to each other, preventing a flow of current.

In summary, the first JFET 10 may have a first pinch-off voltage or a first cut-off voltage, and may include a first top gate region formed on a substrate surface; a first channel region surrounding a first top gate region; and a first bottom gate region under the first channel region. Herein, the first channel region and the first bottom gate region may be formed with a different conductivity type.

As illustrated in FIG. 1, the first device isolation films 106, 107 are formed inside the semiconductor substrate 110. The first device isolation films 106, 107 may be formed to have the same depth as the plurality of device isolation films 103, 104, which are to isolate devices, and they may be located apart from each other.

Figure 5:
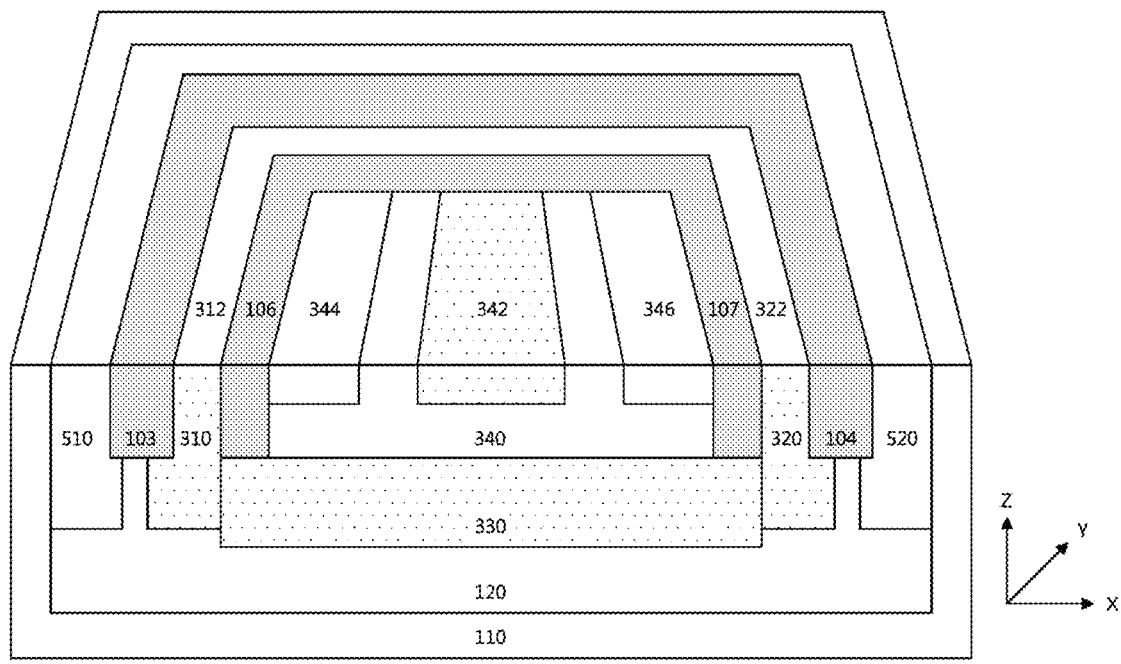
FIG. 5 is a three-dimensional view of a JFET according to an embodiment of the disclosure.

In FIG. 1, first well regions 310, 320 may be formed surrounding a bottom gate region 330. The first well regions 310, 320 may be formed in contact with first device isolation films 106, 107, respectively, and formed deeper than the first device isolation films 106, 107. The first well regions 310, 320 are depicted divided for convenience, and may be a well region connected to each other, as shown in FIG. 5, for example.

A first channel region 340 and a first bottom gate region 330 may have an interface adjacent to each other. In an example, the first channel region 340 is an N-type well region formed by doping of N-type impurities, and the first bottom gate region 330 is a P-type well region formed by doping of P-type impurities. The first channel region 340 may be located between first device isolation films 106, 107, and the first bottom gate region 330 may be located to connect a first well region 310, 320. A first bottom gate region 330 may be formed adjacent to a first device isolation film 106, 107.

Figure 2:
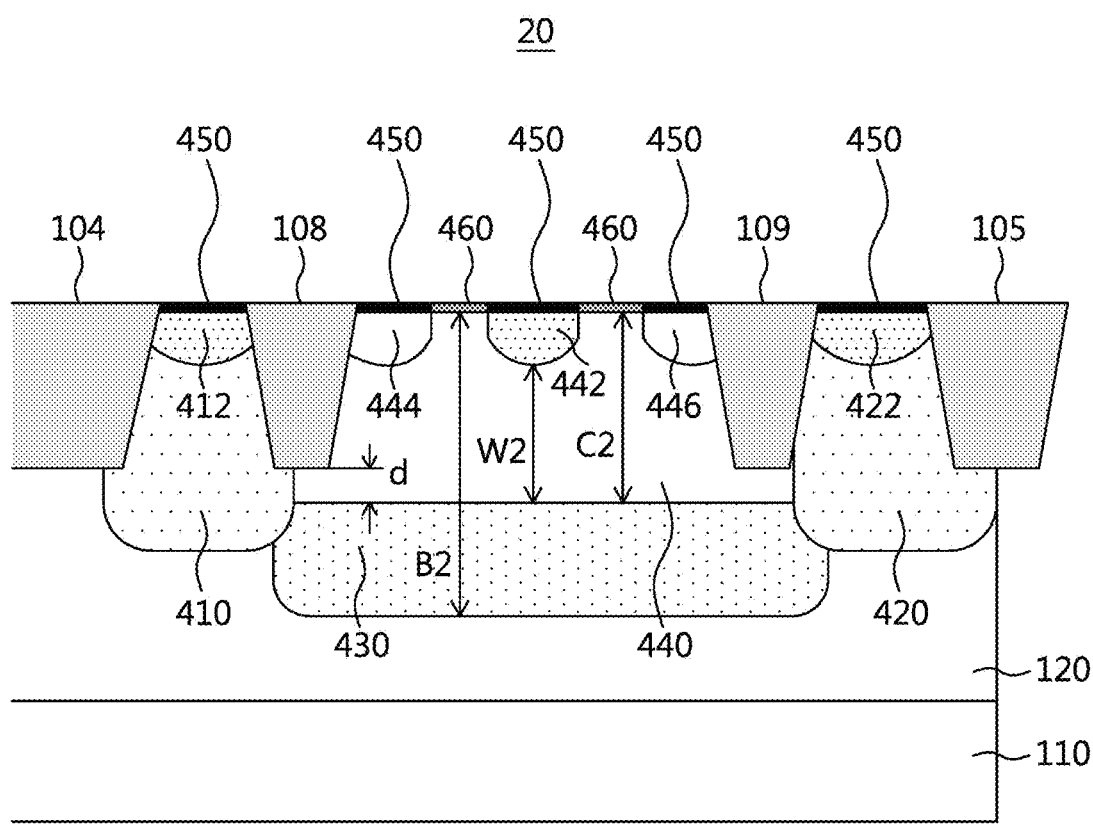
FIG. 2 is a cross-sectional view of a second JFET according to an embodiment of the disclosure.

FIG. 2 is a cross-sectional view of a second JFET according to an embodiment of the disclosure.

With reference to FIG. 2, a second JFET 20 includes a DNW 120 in a semiconductor substrate 110, a plurality of device isolation films 104, 105, 108, 109, the second well regions 410, 420 connected to each other, second pick up regions 412, 422, a second bottom gate region 430, a second channel region 440, a second top gate region 442, a second source region 444 and a second drain region 446, a silicide layer 450, and a silicide blocking film 460.

Herein, the second pick up regions 412, 422 may be formed in a second well region 410, 420. A second top gate region 442, a second source region 444 and a second drain region 446 may be formed in a second channel region 440. The second top gate region 442 and the second bottom gate region 430 are formed by an ion implantation with a P-type dopant. The second channel region 440 is an N-type channel region, which may be a region formed by an ion implantation with an N-type dopant.

The second channel region 440 may have a depth C2. The second channel region 440 has a depth C2 greater than depths of the isolation films 106, 107. A second bottom gate region 430 may have a depth B2. A second channel region 440 may have a second channel width W2. Herein, a second channel width W2 is a distance between a second top gate region 442 and a second bottom gate region 430. A doping concentration of the second top gate region 442 may be higher than a doping concentration of the second bottom gate region 430. The second top gate region 442 and the second bottom gate region 430 may have a same conductivity type, which may be a P-type doping region. Thus, a space between a second top gate region 442 and a second bottom gate region 430 may become a channel region. A channel may open and current may flow by a predetermined voltage amount. On the other hand, when the voltage is over a second pinch-off voltage (or a cut-off voltage), the space between a second top gate region 442 and a second bottom gate region 430 may be connected to each other, preventing the flow of current.

In summary, the second JFET 20 may have a second pinch-off voltage or a second cut-off voltage, and may include a second top gate region formed on a substrate surface; a second channel region surrounding a second top gate region; and a second bottom gate region under a second channel region. Herein, a second channel region and the second bottom gate region may be formed with a different conductivity type.

As illustrated in FIG. 2, second device isolation films 108, 109 are formed inside a semiconductor substrate 110. The second device isolation films 108, 109 may be formed with a same depth of a plurality of device isolation films 103, 104, which are to isolate devices, and they may be located apart from each other.

In FIG. 2, the second well regions 410, 420 may be formed surrounding a second bottom gate region 430. The second well regions 410, 420 may be formed in contact with the second device isolation film 108, 109, respectively, and formed deeper than the second device isolation films 108, 109. The second well regions 410, 420 are depicted divided for convenience, but may be a well region connected to each other, as shown in FIG. 5, for example.

A second channel region 440 and a second bottom gate region 430 may have an interface adjacent to each other. The second channel region 440 is an N-type well region formed by doping of N-type impurities, and the second bottom gate region 430 is a P-type well region formed by doping of P-type impurities. The second channel region 440 may be located between second device isolation films 108, 109, and the second bottom gate region 430 may be located to connect the second well regions 410, 420. The second bottom gate region 430 may be formed deeper than the second device isolation films 108, 109 and spaced from each other with having a distance 'd' because as described earlier, a channel region depth of a second channel region 440 of a second JFET 20 becomes deeper toward a vertical direction of a substrate surface 110.

In FIG. 2, the structure of the second JFET 20 is similar to the structure of the first JFET 10; however, on the basis of the substrate surface 110, the second bottom gate region 430 of the second JFET 20 is located lower than the first bottom gate region 330 of the first JFET 10. Thus, comparing the first JFET 10 with the second JFET 20, the second bottom gate region 430 of the second JFET 20 is deeper than the first bottom gate region 330 of the first JFET 10 as denoted by distance 'd'.

A thick buffer film 500 (see FIG. 7D) may only be formed in the first JFET 10 during a manufacturing process to have a different pinch-off voltage for the first JFET 10 and the second JFET 20. The depth or width may be different because the thick buffer film 500 may serve as a mask to block impurities. The thick buffer film 500 may be formed in the same step forming a gate insulating film. For example, the thick buffer film 500 may be formed when forming the thick gate insulating film.

Likewise, according to FIG. 1 and FIG. 2, a JFET providing a different pinch-off voltage may be produced. Based on an existence of the thick buffer film 500, a first JFET 10 and a second JFET 20 may provide a different pinch-off voltage, which will be further described in a manufacturing process of FIGS. 7A-7J. That is, in a manufacturing process, a thick buffer film 500 with a predetermined thickness may be formed in the first JFET 10 and not formed in the second JFET 20. Herein, when an impurity doping process is performed in a JFET channel region, a pinch-off voltage may become different.

Figure 3:
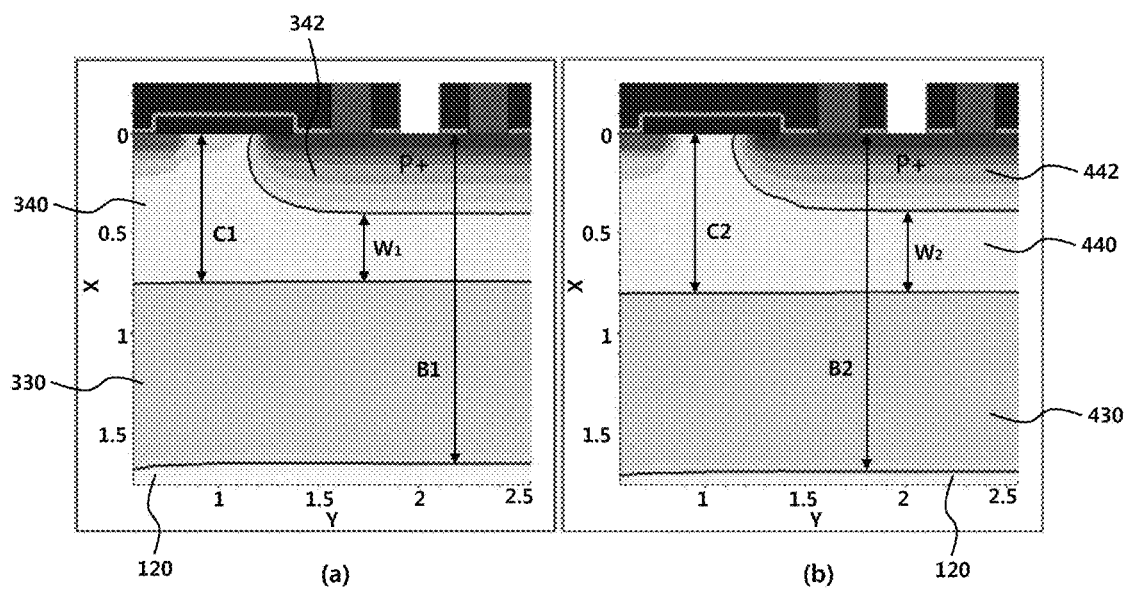
FIG. 3 is a result of JFET simulation according to an embodiment of the disclosure.

FIG. 3 is a result of JFET simulation according to an embodiment of the disclosure.

First, with reference to FIG. 3A, a first JFET 10 includes a first bottom gate region 330, a first channel region 340, and a first top gate region (P+, 342) in a semiconductor substrate. The first channel region 340 may have a first channel width W1. Herein, a first channel width W1 is a distance between a first top gate region 342 and a first bottom gate region 330. A doping concentration of a first top gate region 342 may be higher than a doping concentration of a first bottom gate region 330. A first top gate region 324 and a first bottom gate region 330 may have the same conductivity type, which may be a P-type doping region.

Before forming a channel region, a thick buffer film may be formed on a substrate surface, and an ion implantation may be performed. In this case, the depth of an ion implantation is diminished by the thick buffer film. Therefore, in a case of the first JFET 10, the first channel width W1 may become smaller than the second channel width W2 of a second JFET 20.

With reference to FIG. 3B, a second JFET 20 includes a second bottom gate region 430, a second channel region 440, and a second top gate region (P+, 442) in a semiconductor substrate. A second channel region 440 may have a second channel width W2. Herein, the second channel width W2 is a distance between a second top gate region 442 and a second bottom gate region 430. Although the difference seems to be tiny, the second channel width W2 is bigger than a first channel width W1. The difference may be due to forming the channel region of the second JFET 20 by performing ion implantation without the buffer film.

(a) of FIG. 3 shows a first JEFT 10 using a thick buffer film 500 as a mask when forming a first channel region 340. On the other hand, (b) of FIG. 3 shows a second JFET 20 forming a second channel region 440 by performing an ion implantation for a channel region with no thick buffer film 500 mask. Each channel width is different as shown. The channel width W2 of the second JFET is formed to be bigger than the channel width W1 of the first JFET.

As illustrated in FIG. 3, a depth C1 of a bottom surface of a first channel region 340 is shallower than a depth C2 of a bottom surface of a second channel region 440. A depth B1 of a bottom surface of a first bottom gate region 330 is shallower than a depth B2 of a bottom surface of a second bottom gate region 430. However, the depth of a first top gate region (P+, 342) and the depth of a second top gate region (P+, 442) are identical to each other because they are formed in a same step with a same process condition. It is because when performing an ion implantation to a first top gate region (P+, 342) and a second top gate region (P+, 442), they are formed without a thick buffer film 500.

Figure 4:
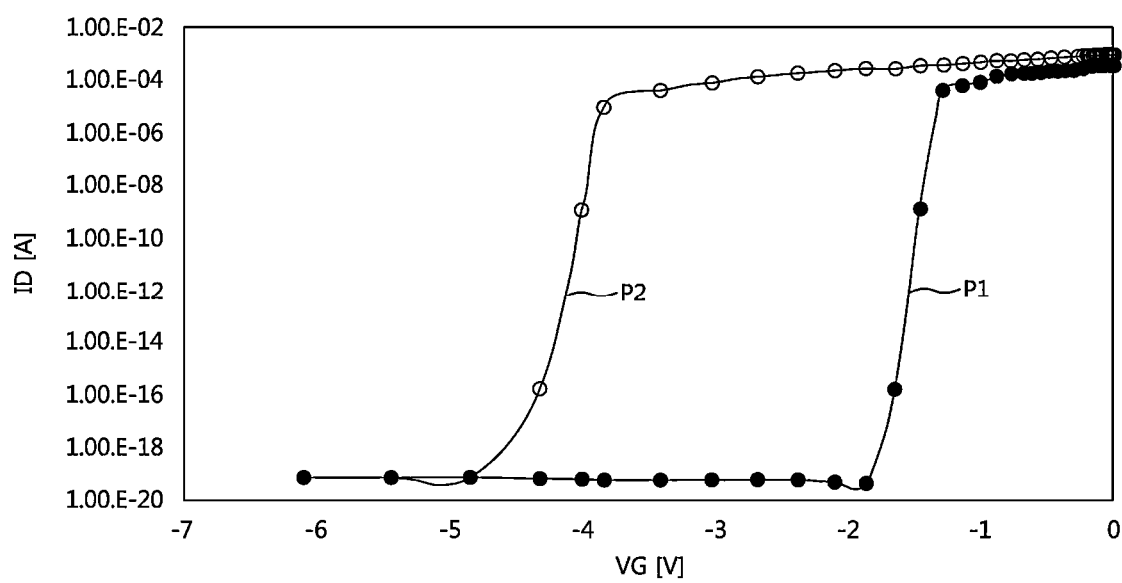
FIG. 4 is a graph of gate voltage (VG)-drain current (ID) of JFET according to an embodiment of the disclosure.

FIG. 4 is a graph of gate voltage (VG)-drain current (ID) of JFET, according to an embodiment of the disclosure.

In FIG. 4, a P1 curve refers to a first JFET 10 device having a small channel width. A P2 curve indicates a second JFET 20 device having a large channel width. A pinch-off voltage of a first JFET 10 device may be between −1V to −2V. A pinch-off voltage of a second JFET 20 device may be between −5V to −4V. With respect to an absolute value, a pinch-off voltage of a first JFET 10 device is lower than a pinch-off voltage of a second JFET 20 device because, as described in FIG. 3, the channel width of a first JFET 10 device is smaller than a channel width of a second JFET 20 device.

FIG. 5 is a three-dimensional view of a JFET according to an embodiment of the disclosure. A first JFET 10, similar to a second JFET 20, will be further described.

With reference to FIG. 5, a DNW 120 may be included in a semiconductor substrate 110. A first channel region 340 and a first bottom gate region 330 may be formed on a DNW 120. A first top gate region 342, a first source region 344, and a first drain region 346 may be formed in a first channel region 340.

And, first device isolation films 106, 107 may surround a first top gate region 342, a first source region 344, and a first drain region 346. First well regions 310, 320 may surround the first device isolation films 106, 107. Other device isolation films 103, 104 may surround the first well regions 310, 320. Also, N-type well regions (NW) 510, 520 surrounding other device isolation films 103, 104 may be formed. The N-type well regions (NW) 510, 502 may be electrically connected to a DNW 120 and may electrically isolate a first JFET 10 from another device. A depth B1 of a first bottom gate region 330 may be formed deeper than a depth of the N-type well regions (NW) 510, 520.

Figure 6:
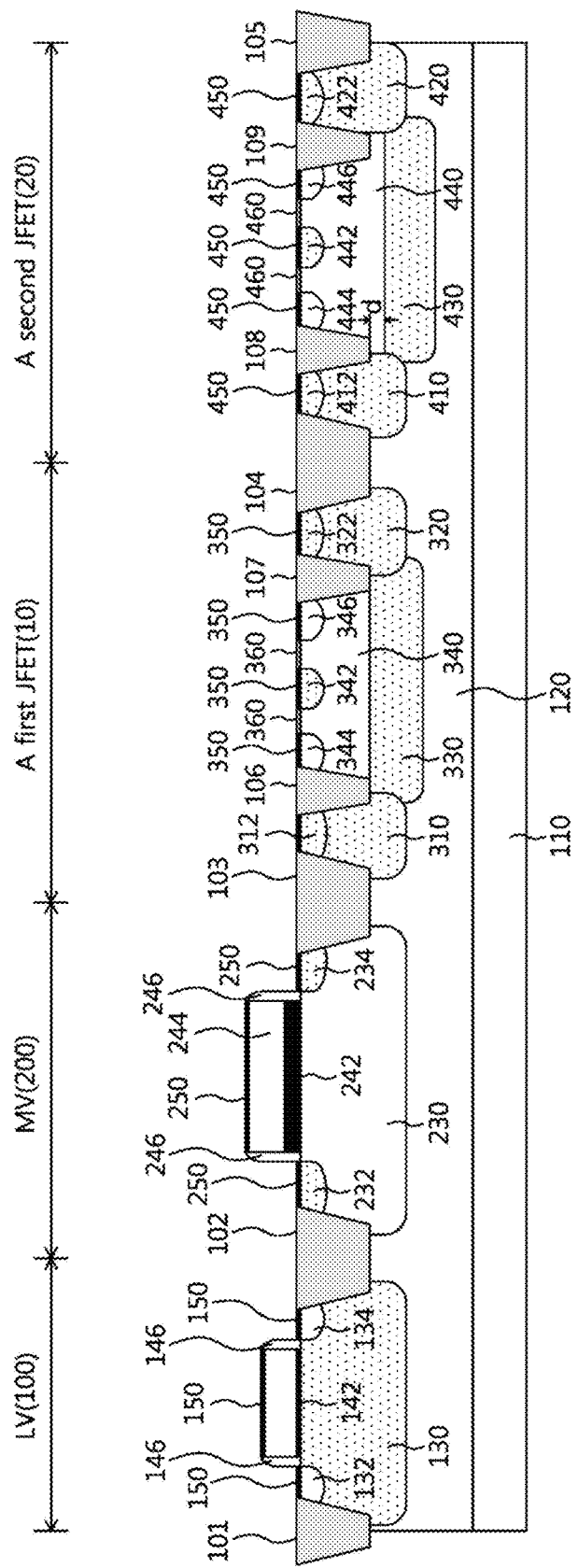
FIG. 6 is a cross-sectional view of a semiconductor device including a JFET according to an embodiment of the disclosure.

FIG. 6 is a cross-sectional view of a semiconductor device including a JFET, according to an embodiment of the disclosure.

With reference to FIG. 6, a semiconductor device where a LV MOS 100, a MV MOS 200, a first JFET 10, a second JFET 20 devices are formed together in a semiconductor device in an embodiment of the disclosure is given as an example. A LV MOS 100, a MV MOS 200, a first JFET 10, a second JFET 20 devices may be formed together with a non-volatile memory semiconductor device such as EEPROM device.

A plurality of device isolation films 101-105 with a predetermined depth may be formed to isolate devices in a space between devices 10 to 40. The depths of a plurality of device isolation films 101 to 105 are the same.

A LOCOS, a shallow trench isolation (STI), a medium trench isolation (MTI), and a deep trench isolation (DTI) may be used as a plurality of device isolation films 101 to 105. A STI is used as a device isolation film in an embodiment of the disclosure.

A first device isolation film 106, 107 and a second device 108, 109 are formed inside a first JFET 10 and a second JFET 20. A first device isolation film 106, 107 and a second device isolation film 108, 109 have a same depth with a plurality of device isolation films 101 to 105, and they are formed simultaneously in a same step. A first device isolation film 106, 107 and a second device isolation film 108, 109 may be formed to surround a first channel region 340 of a first JFET 10 and a second channel region 440 of a second JFET 20.

A deep well region 120 (hereafter, referred to as DNW) doped by an N-type dopant may be formed in a semiconductor substrate 110. For a LV MOS 100, a P-type well region 130 (hereafter, referred to as PW region) doped by a P-type dopant may be formed in a DNW 120. A PW region 130 may be formed deeper than the device isolation films 101, 102. And, an NMOS drain region 132 and a source region 134 doped by N-type impurities may be formed in a PW region 130. An NMOS drain region 132 and a source region 134 may be respectively located between each of the device isolation films 101, 102 and a gate electrode 150.

A LV MOS 100 includes a first gate electrode 144 formed on a semiconductor substrate 110. A first gate insulating film 142 having a predetermined thickness is formed under a first gate electrode 144, and a first LDD spacer 146 is formed at a side of a first gate electrode 144.

A silicide layer 150 is formed on a surface of a first gate electrode 144, an NMOS drain region 132, and a source region 134 of a LV MOS 100.

An N-type well region 230 (NW region) formed by an N-type doping material may be formed in a DNW 120 of a MV MOS 200. A NW region 230 may be formed deeper than a device isolation film 102, 103. A PMOS drain region 232 and a source region 234 doped by P-type impurities may be formed in an NW region 230. A PMOS drain region 232 and a source region 234 may be respectively located between a device isolation film 102, 103 and a second gate electrode 244.

A MV MOS 200 includes a second gate electrode 244 formed on a semiconductor substrate 110. A second gate insulating film 242 having a predetermined thickness is formed under a second gate electrode 244, and a second LDD spacer is formed at a side of a second gate electrode 244.

A silicide layer 250 is formed on a surface of a second gate electrode 244, a PMOS drain region 232 and a source region 234 of a MV MOS 200.

As shown in FIG. 6, in a LV MOS 200 and a MV MOS 200, the width of a first gate electrode 144 and the width of a second gate electrode 244 are different. Since a MV MOS 200 may operate in a higher voltage than a LV MOS 100, the width of the second gate electrode 244 of a MV MOS 200 is bigger than a width of a first gate electrode 144 of a LV MOS 100. Likewise, a second gate insulating film 242 of a MV MOS 200 is thicker than a first gate insulating film 142 of a LV MOS 100.

A first JFET 10 and a second JFET 20 have a different pinch-off voltage. The first JFET 10 has a lower pinch-off voltage than the second JFET 20. To have a different pinch-off voltage, as shown in FIG. 6, a first and a second channel region 340, 400 may have different channel widths. Herein, a channel width may refer to a distance between a top gate region 342, 442 and a bottom gate region 330, 430. The longer the distance is, the bigger a channel width becomes, and according to that, the pinch-off voltage may become correspondingly bigger. Since a top gate region 342, 442 is located on a substrate surface, it may be called a top gate region. Also, since a bottom gate region 330, 403 is located under a substrate, it may be called a bottom gate region. Therefore, a space between a top gate region 342, 442 and a bottom gate region 330, 340 becomes a channel region. A channel may open, and a current may flow by a predetermined voltage. On the other hand, when the voltage is over a pinch-off voltage, a space between a top gate region 342, 442 and a bottom gate region 330, 440 may be adjacent to each other, preventing a flow or a current.

FIGS. 7A-7J show a manufacturing method of a semiconductor device including a JFET, according to an embodiment of the disclosure.

Figure 7A:
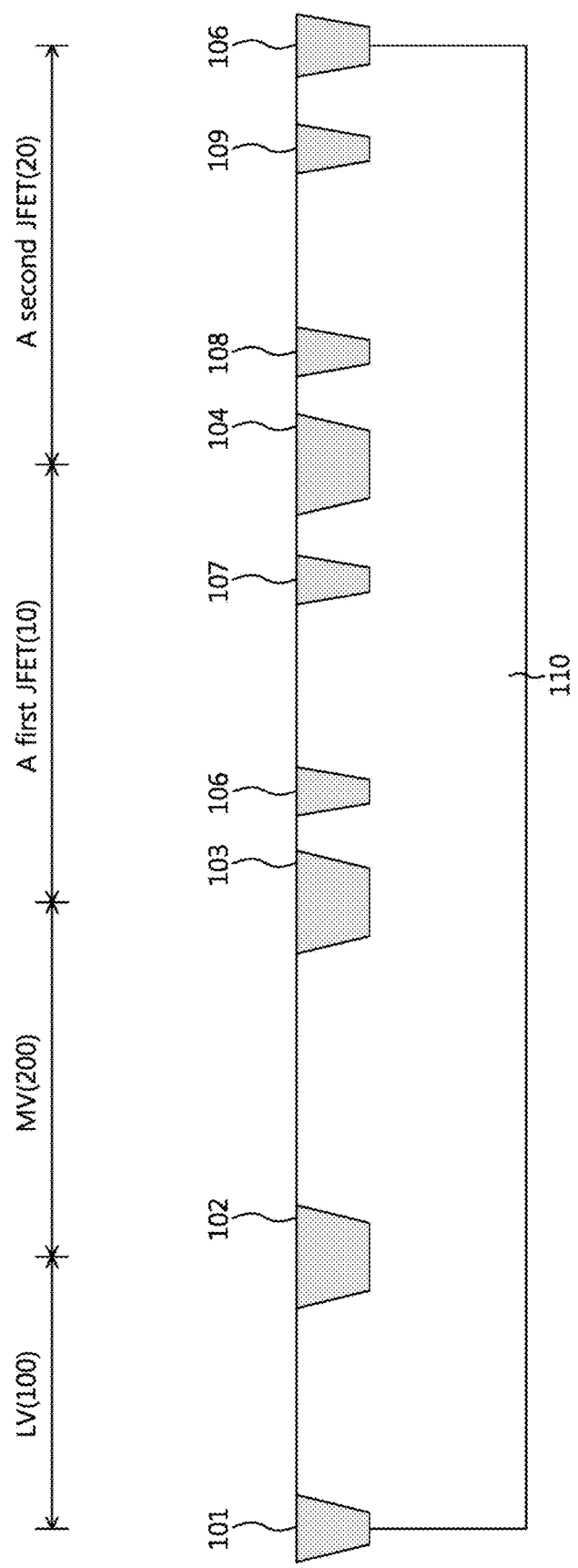

With reference to FIG. 7A, a plurality of device isolation films 101 to 105 may be formed to isolate a LV MOS 100, a MV MOS 200, a first JFET 10, and a second JFET 20 devices. A JFET of a first JFET 10 and a second JFET 20 provide a different pinch-off voltage. According to a provided pinch-off voltage, a JFET may form more device region. A plurality of device isolation films 101 to 105 may be formed on a substrate surface with a predetermined depth to compart each region. A STI process is selected for an embodiment.

Furthermore, a first device isolation film 106, 107 and a second device isolation film 108, 109 may be formed further in a first JFET 10 and a second JFET 20. A first device isolation film 106, 107 and a second device isolation film 108, 109 have a same depth with a plurality of device isolation films 101 to 105, and they are spaced from each other. A first channel region 340 may be formed later between first device isolation films 106, 107. Likewise, a second channel region 440 may be formed later between second device isolation films 108, 109.

With reference to FIG. 7B, a DNW 120 may be formed to isolate a semiconductor substrate 110, a first and a second bottom gate region electrically. A DNW 120 may be formed deeper than the device isolation films 101 to 109, and N-type impurities are provided in a DNW 120.

Figure 7C:
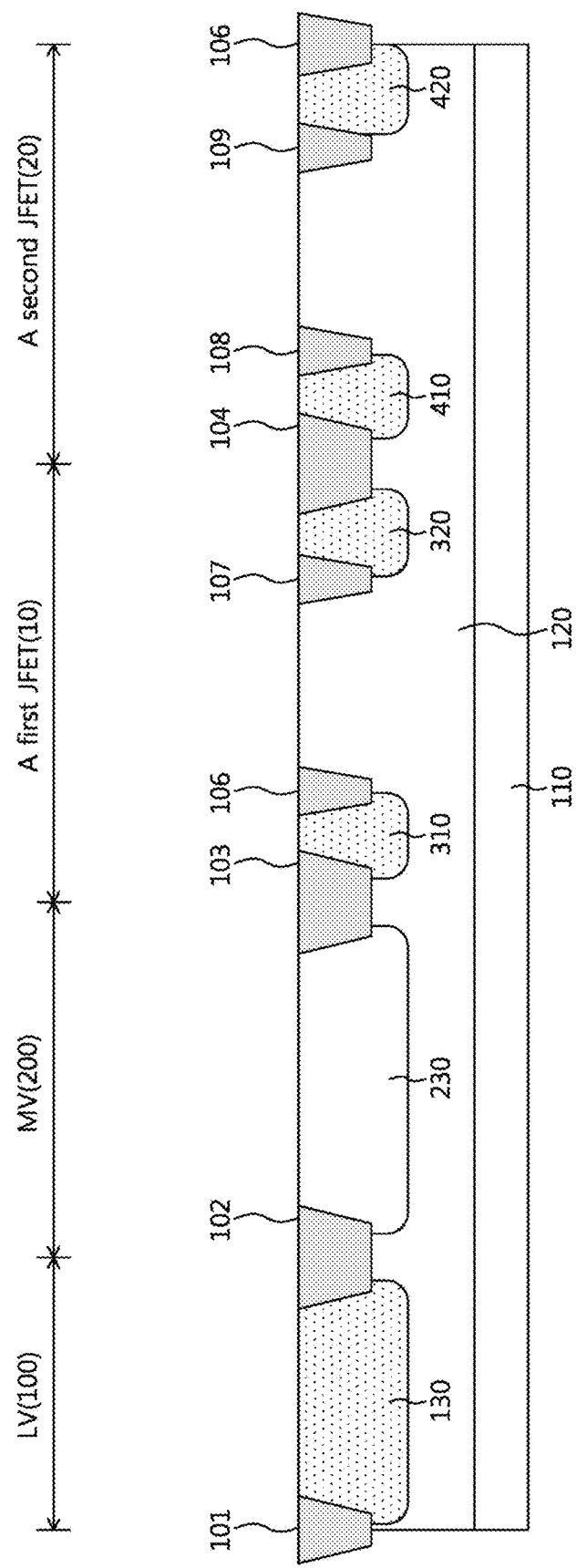

With reference to FIG. 7C, a forming process of a well region is performed in a DNW 120. As shown in FIG. 7C, a PW region is formed in a LV MOS 100, and an NW region 230 is formed in a MV MOS 200. Also, shown in a first JFET 10 and a fourth region 40, a first well region 310, 320 and a second well region 410, 420 are formed. As illustrated above, a first well region 310, 320 is connected to each other. A second well region 410, 420 is also connected to each other.

In FIG. 7C, the depths of well regions are identically formed. A PW region and an NW region formed in a LV MOS 100 and a MV MOS 200 may be located between a plurality of device isolation films (101 and 102, 102 and 103). And, a first well region 310, 320 of a first JFET 10 may be located between a device isolation film 103, 104 and a first device isolation film 106, 107. A second well region 410, 420 of a second JFET 20 may be formed between a device isolation film 104, 105 and a second device isolation film 108, 109.

Figure 7D:
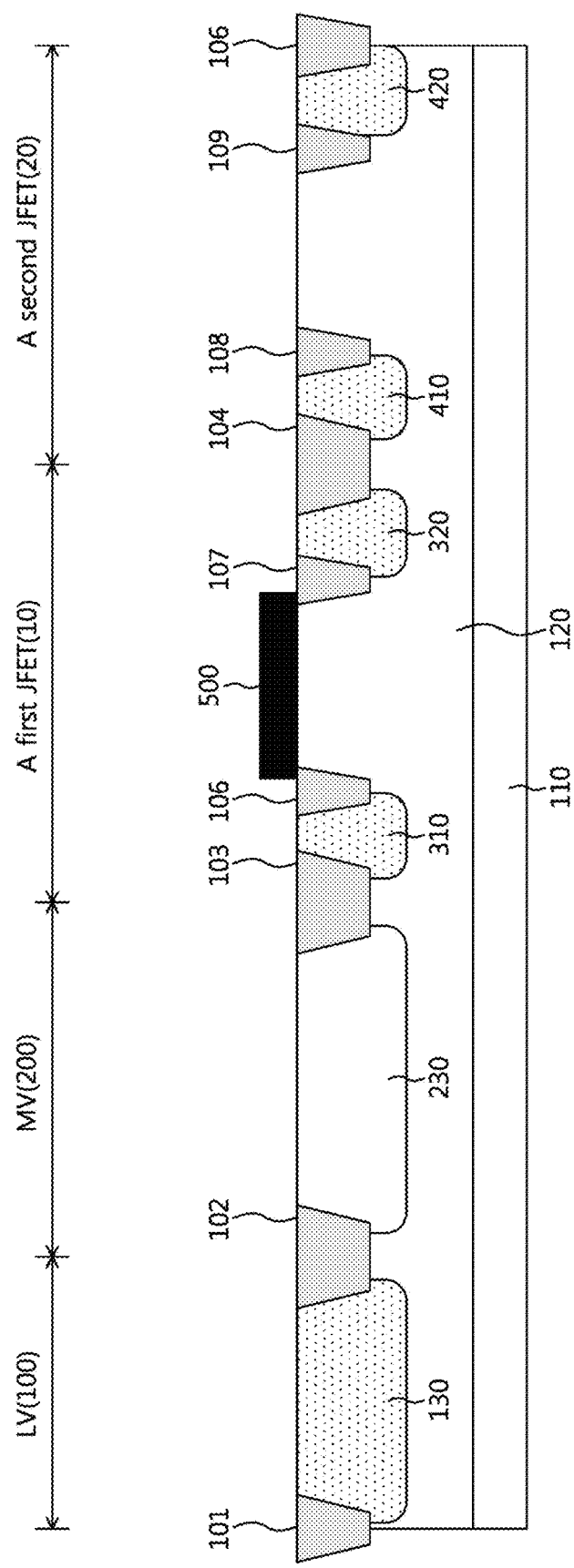

FIG. 7D is a drawing of forming a thick buffer film.

With reference to FIG. 7D, a process forming a thick buffer film 500 may be applied to a device where a relatively low pinch-off voltage is set in among JFETs. In an embodiment, a thick buffer film 500 is formed in a first JFET 10 in order that the JFET of a first JFET 10 provides a pinch-off voltage from −1V to −2V, and the JFET of a second JFET 20 provides a pinch-off voltage from −3V to −5V. A thick buffer film 500 is not formed in a second JFET 20. Thus, based on an existence of the thick buffer film 500, the pinch-off voltage may be changed. The thick buffer film 500 is formed on a first channel region 340 in FIG. 7D. The thick buffer film 500 may be created in a process forming a gate insulating film. Therefore, a thick buffer film 500 may become a type of a thick gate insulating film.

In FIG. 7D, according to the thickness of a thick buffer film 500 formed in a first JFET 10, the pinch-off voltage of a first JFET 10 may be adjusted.

Figure 7E:
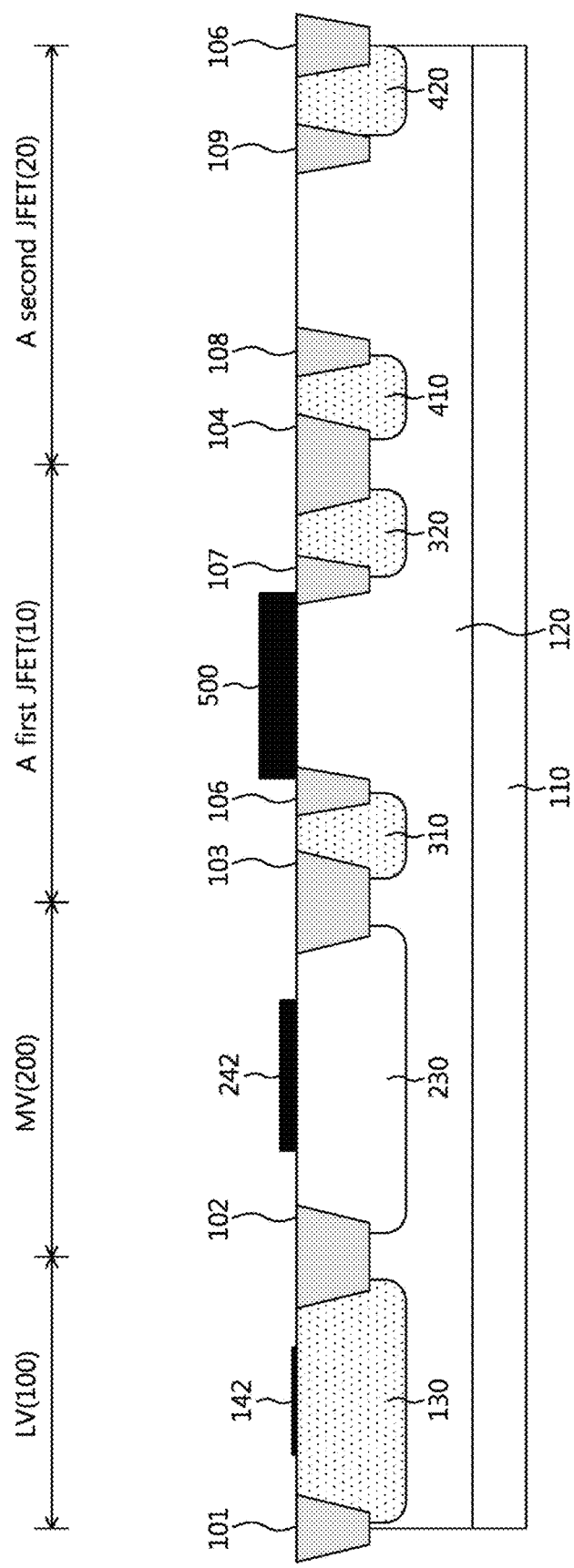

With reference to FIG. 7E, a first and a second gate insulating film 142, 242 may be formed in a LV MOS 100, a MV MOS 200, respectively, and a thick buffer film 500 may be formed in a first JFET 10. The second gate insulating film 242 is formed thicker than a first gate insulating film 142. And, the thick buffer film 500 is formed thicker than the second gate insulating film 242.

Figure 7F:
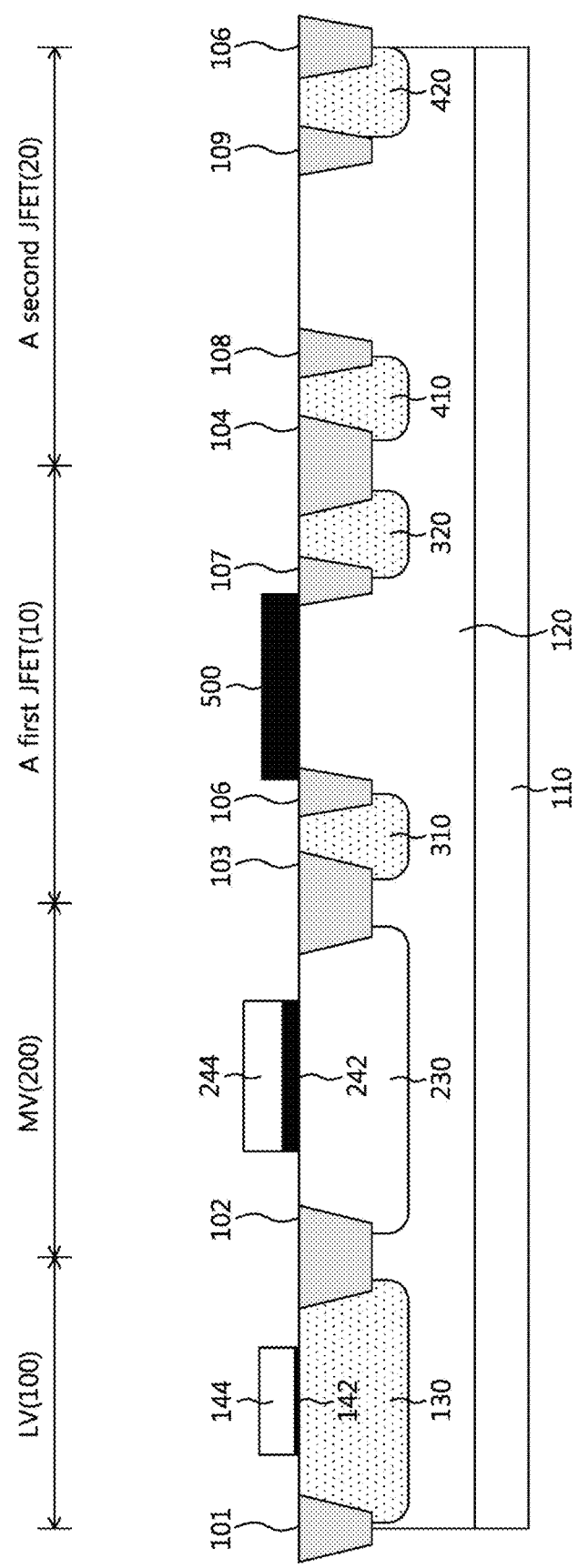

With reference to FIG. 7F, a first and a second gate electrode 144, 244 may be formed on a first and a second gate insulating film 142, 242, respectively. A length of a first gate electrode 144 is less than a length of a second gate electrode 244. A gate electrode is not formed for a first JFET 10 and a second JFET 20, which are JFET regions.

Figure 7G:
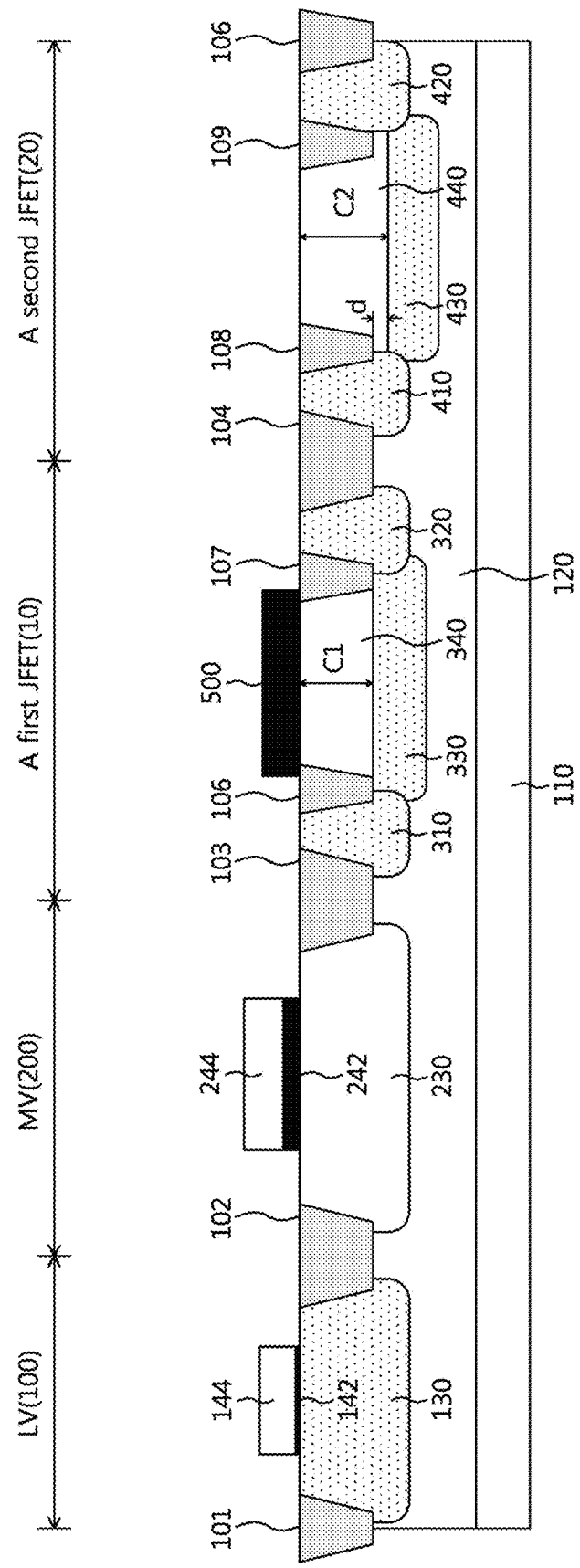

With reference to FIG. 7G, when the forming of a gate electrode is completed, a first ion implantation process is performed to a first JFET 10 and a second JFET 20. Accordingly, a first and a second low concentration bottom gate region 330, 440 may be formed simultaneously.

By performing a second ion implantation process, a first and a second channel region 340, 440 are formed simultaneously. Herein, a thick buffer film 500 is used as a mask in a first and a second ion implantation. A thick buffer film 500 is continually maintained during a first and a second ion implantation process.

A first and a second bottom gate region 330, 430 may be formed by implanting boron as a P-type dopant to a substrate with using a thick buffer film 500 as a mask. Then, a first and a second channel region 340, 440 may be formed by implanting phosphorus as an N-type dopant to a substrate with using a thick buffer film 500 as a mask.

In FIG. 7G, the depths of a first and a second channel region 340, 440 formed in a first JFET 10 and a second JFET 20 are different. Also, the depths of a first and a second bottom gate region 330, 430 are different to each other.

As shown in FIG. 7G, the depth C1 of a bottom surface of a first channel region 340 is shallower than the depth C2 of a bottom surface of a second channel region 440. A depth B1 of a bottom surface of a first bottom gate region 330 is shallower than a depth B2 of a bottom surface of a second bottom gate region 440.

Since a thick buffer film 500 is formed in a first JFET 10, the thick buffer film 500 may function as a mask to block impurities during an ion implantation process. Thus, a first bottom gate region 330 of a first JFET 10, where the thick buffer film 500 is formed, is formed relatively closer to a substrate surface 110 than a second bottom gate region 430 of a second JFET 20.

In FIG. 7G, a first bottom gate region 330 of a first JFET 10 may be in contact with a first device isolation film 106, 107. However, a second bottom gate region 430 of a second JFET 20 may be formed to be spaced from a second device isolation film 108, 109 with a predetermined gap (d). It is because a second bottom gate region 430 of a second JFET 20, where a thick buffer film 500 does not exist, is formed deeper than a second device isolation film 108, 109.

In FIG. 7G, a depth C1 of a first channel region 340 of a first JFET 10 is shallower than a depth C2 of a second channel region 440 of a second JFET 20. When the depth of a channel region is relatively small, a pinch-off may be correspondingly easier, and the pinch-off voltage may become lower. On the other hand, in a second JFET 20, a channel region may be increased because the depth C2 of a second channel region is deeper than the depth C1 of the first JFET 10; accordingly, a pinch-off voltage may be relatively higher. Herein, the width of channel regions W1, W2, which were described earlier, may refer to the shortest distance between a low concentration doping region and a top gate region. Or, the widths W1, W2 of a channel region may refer to the shortest distance between a top gate region and a bottom gate region. However, the depths C1, C2 of a channel region may refer to the maximum depth of a channel region based on a substrate surface. Thus, C1 and C2 may be bigger than W1 and W2.

Figure 7H:
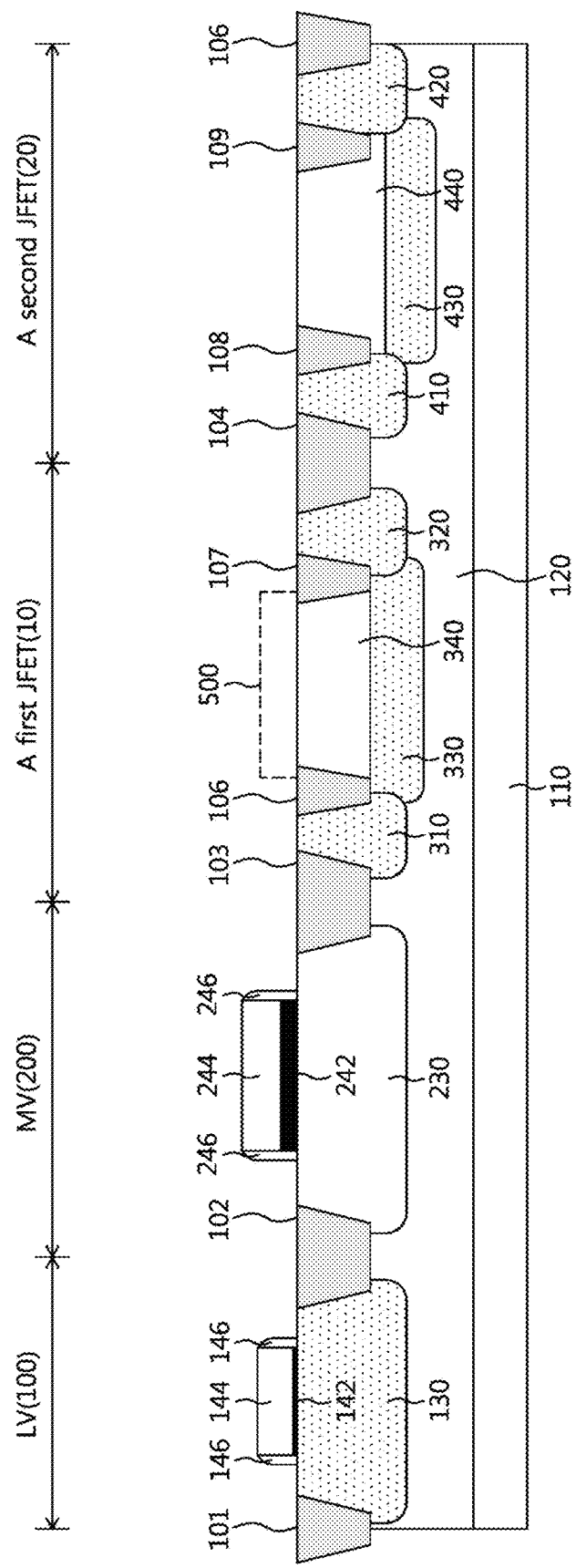

With reference to FIG. 7H, after forming a JFET well region, a lightly doped region or a lightly doped drain (LDD) is formed around a first and a second gate electrode 144, 244 of a LV MOS 100 and a MV MOS 200. And, a first and a second LDD spacer 146, 246 are formed. Since a gate electrode is not formed in a first JFET 10 and a second JFET 20, there may be no desire to form an LDD spacer. A thick buffer film 500 in a first JFET 10 is all removed with the forming of the first the second LDD spacer 146, 246 through an etch-back process. Thus, a process to form a first and a second LDD spacer 146, 246 of a LV MOS 100 and a MO MOS 200 and a process to remove a thick buffer film 500 of a first JFET 10 are performed simultaneously.

When a process to form a first and a second LDD spacer 146, 246 is completed, e.g., as depicted in FIG. 7H, a first and a second gate electrode 144, 244 may be formed in a LV MOS 100 and a MV MOS 200, respectively, and a thick buffer film 500 may be removed in a first JFET 10.

Figure 7I:
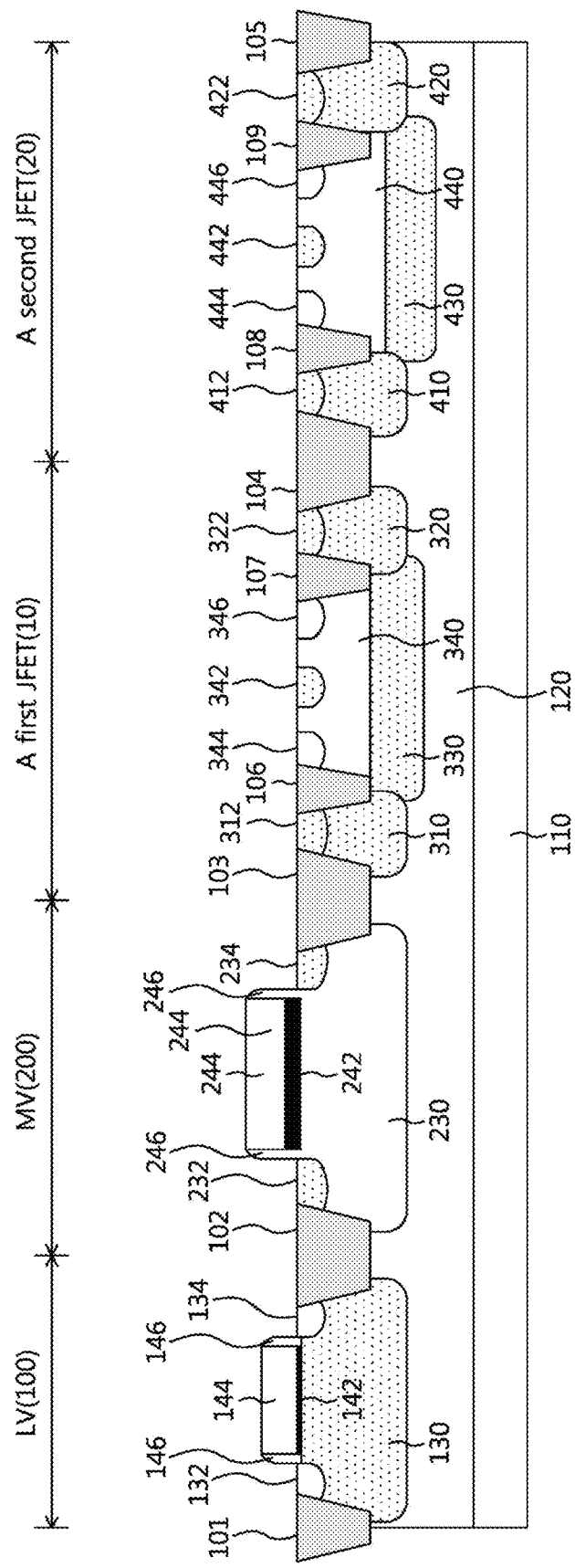

With reference to FIG. 7I, a high concentration doping region may be formed for each well region. Specifically, an NMOS source region and drain region 132, 134 may be formed in a PW region 130 of a LV MOS 100. A PMOS source region and a drain region 232, 234 may be formed in an NW region 230 of a MV MOS 200. When looking at a first JEFT 10 and a second JFET 20, a first pick up region 312, 322 and a second pick up region 412, 422 are formed in a first well region 310, 320 and a second well region 410, 420. A first and a second top gate region 342, 442, a first and a second high concentration source region 344, 444, and a first and a second high concentration drain region 346, 446 are formed in a first and a second channel region 340, 440.

Figure 7J:
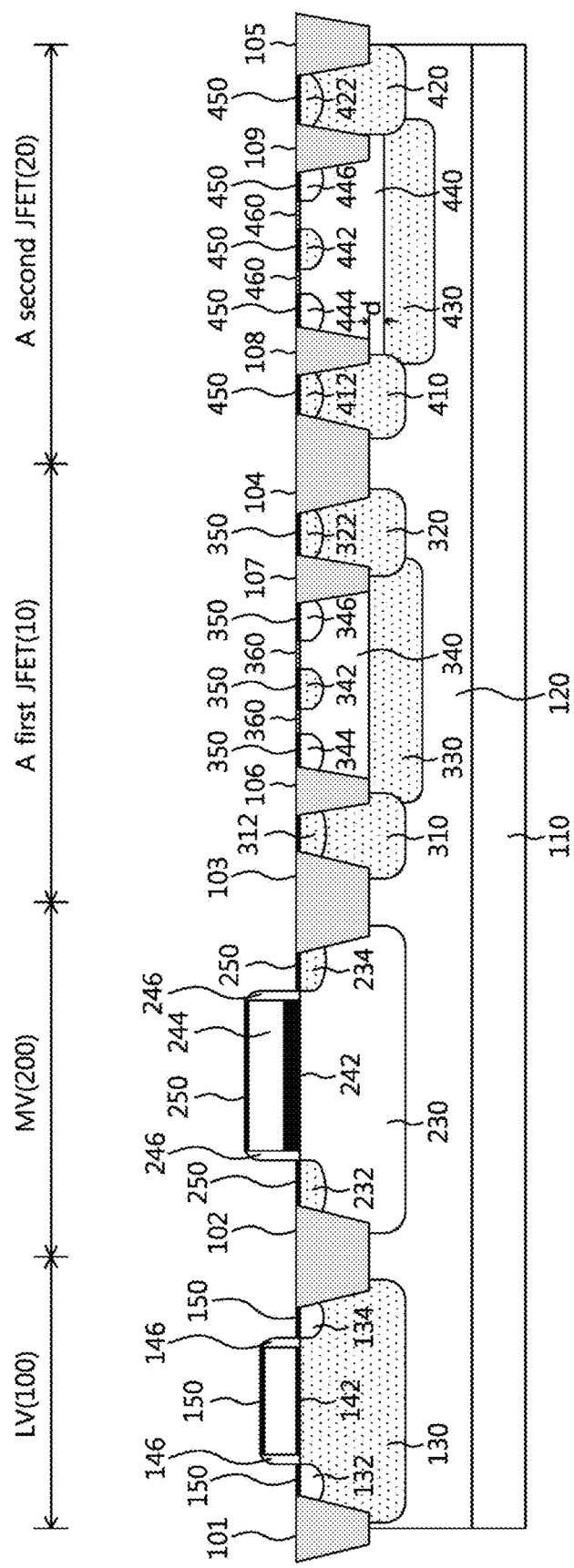

With reference to FIG. 7J, through a silicide process, silicide layers 350, 450 may be formed on a first and a second high concentration source region 344, 444, respectively, and on a first and a second high concentration drain region 346, 446, respectively. Specifically, a silicide process is equally applied in a LV MOS or a second JFET 10 to 40. Silicide layers 150, 250, 350, 450 may be formed on tops of source regions and drain regions 132, 134, 232, 234, 344, 346, 444, 446, tops of a first and a second gate electrode 144, 244, surfaces of first pick up regions 312, 322, second pick up regions 412, 422, and a first and a second top gate region 342, 442. In a first JEFT 10 and a second JFET 20, silicide blocking films 360, 460 may be formed between a first top gate region 342, a second top gate region 442 and a first second source region 344, a second source region 444, and between a first top gate region 342, a second top gate region 442 and a first high concentration drain region 346, a second high concentration drain region 446. A silicide layer is not formed in silicide blocking films 360, 460 due to the presence of the silicide blocking film. For example, in a first JFET 10, a first and a second top gate region 342, 442 may be divided into a source region 344 or a drain region 346 by a silicide blocking film 360, 460.

As disclosed above, a semiconductor device with a JEFT having multiple pinch-off voltages may be formed. Traditionally, when a JEFT having a different pinch-off voltage is made, just as described in an embodiment, a manufacturing process of a first JFET and a second JEFT are performed independently, and time and cost for such manufacturing increase.

According to the above disclosure, by using a MOSFET device process, a semiconductor device with a JFET having multiple pinch-off voltages may be efficiently produced.

Therefore, when making a JFET having a different pinch-off voltage, time and cost for manufacturing may be reduced when compared with a traditional case that has separated manufacturing processes.

Also, since there is no need to design a large area of JFET to compensate a current drive efficiency inside an IC chip compared with a traditional case, it is possible to design a small IC chip area.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a semiconductor device, the method comprising:
   preparing a first region and a second region in a substrate;
   forming a first isolation region and a second isolation region in the first region;
   forming a third isolation region and a fourth isolation region in the second region;
   forming a first bottom gate region in the first region, the first bottom gate region disposed in contact with the first isolation region and the second isolation region, and
   forming a second bottom gate region in the second region, the second bottom gate region spaced apart from the third isolation region and the fourth isolation region;
   forming a first channel region over the first bottom gate region;
   forming a second channel region over the second bottom gate region;
   forming a first top gate region in the first channel region;
   forming a second top gate region in the second channel region; and
   forming a first silicide layer and a second silicide layer on the first top gate region and the second top gate region, respectively,
   wherein the first bottom gate region has a depth less than a depth of the second bottom gate region.

2. The method of claim 1,
   wherein the second bottom gate region is disposed below the third isolation region and the fourth isolation region.

3. The method of claim 1, further comprising:
   forming an insulating buffer film between the first isolation region and the second isolation region before forming the first bottom gate region and the second bottom gate region;
   performing an ion implantation on the substrate through the insulating buffer film to form the first bottom gate region; and
   removing the insulating buffer film.

4. The method of claim 1, further comprising:
forming a first source region and a first drain region in the first channel region spaced apart from the first top gate region; and
forming a second source region and a second drain region in the second channel region spaced apart from the second top gate region.

5. The method of claim 1, further comprising:
forming a first well region and a second well region in the substrate, wherein the first well region and the second well region contact the first isolation region and the second isolation region, respectively; and
forming a third well region and a fourth well region in the substrate, wherein the third well region and the fourth well region contact the third isolation region and the fourth isolation region, respectively.

6. The method of claim 1,
wherein a first junction-gate field-effect transistor (JFET) having a first pinch-off voltage is formed between the first isolation region and the second isolation region, the first JFET comprising the first top gate region, the first channel region and the first bottom gate region, and
wherein a second JFET having a second pinch-off voltage is formed between the third isolation region and the fourth isolation region, the second JFET comprising the second top gate region, the second channel region and the second bottom gate region.

7. A method of manufacturing a semiconductor device, the method comprising:
preparing a first region and a second region in a substrate;
forming a first isolation region and a second isolation region in the first region;
forming a third isolation region and a fourth isolation region in the second region;
performing a first ion implantation to form a first bottom gate region and a second bottom gate region in the first region and the second region, respectively, wherein the first bottom gate region is formed in contact with the first isolation region and the second isolation region, wherein the second bottom gate region is spaced apart from the third isolation region and the fourth isolation region;
performing a second ion implantation to form a first channel region and a second channel region over the first bottom gate region and the second bottom gate region, respectively; and
performing a third ion implantation to form a first top gate region and a second top gate region in the first channel region and the second channel region, respectively,
wherein the first bottom gate region has a depth less than a depth of the second bottom gate region.

8. The method of claim 7, further comprising:
forming an insulating buffer film in the first region before the performing the first ion implantation through the insulating buffer film to form the first bottom gate region.

9. The method of claim 7, further comprising:
forming a first source region and a first drain region in the first channel region spaced apart from the first top gate region; and
forming a second source region and a second drain region in the second channel region spaced apart from the second top gate region.

10. The method of claim 7, further comprising:
forming a first well region and a second well region in the substrate, wherein the first well region and the second well region contact the first isolation region and the second isolation region, respectively; and
forming a third well region and a fourth well region in the substrate, wherein the third well region and the fourth well region contact the third isolation region and the fourth isolation region, respectively.

11. A method of manufacturing a semiconductor device, the method comprising:
preparing a first region and a second region in a substrate;
forming a first isolation region and a second isolation region in the first region;
forming an insulating buffer film between the first isolation region and the second isolation region;
performing a first ion implantation through the insulating buffer film to form a first bottom gate region, wherein the first bottom gate region is formed in contact with the first isolation region and the second isolation region;
performing a second ion implantation to form a first channel region over the first bottom gate region;
removing the insulating buffer film;
performing a third ion implantation to form a first top gate region in the first channel region;
forming a third isolation region and a fourth isolation region in the second region;
forming a second bottom gate region by performing the first ion implantation, wherein the second bottom gate region is spaced apart from the third isolation region and the fourth isolation region;
forming a second channel region over the second bottom gate region by performing the second ion implantation; and
forming a second top gate region in the second channel region by performing the third ion implantation.

12. The method of claim 11,
wherein a first junction-gate field-effect transistor (JFET) having a first pinch-off voltage is formed in the first region, the first JFET comprising the first top gate region, the first channel region and the first bottom gate region, and
wherein a second JFET having a second pinch-off voltage is formed in the second region, the second JFET comprising the second top gate region, the second channel region and the second bottom gate region.

13. The method of claim 11,
wherein the second bottom gate region is disposed below the third isolation region and the fourth isolation region.

* * * * *